United States Patent
Hong

[11] Patent Number: 5,486,714
[45] Date of Patent: Jan. 23, 1996

[54] TRENCH EEPROM WITH TUNNEL OXIDE IN TRENCH

[75] Inventor: Gary Hong, Hsin-chu, Taiwan

[73] Assignee: United Microelectronics Corporation, Hsinchu, Taiwan

[21] Appl. No.: 445,939

[22] Filed: May 22, 1995

Related U.S. Application Data

[62] Division of Ser. No. 276,605, Jul. 18, 1994, Pat. No. 5,429,970.

[51] Int. Cl.$^6$ .................................................. H01L 27/115
[52] U.S. Cl. ............................................ 257/321; 257/330
[58] Field of Search ................................... 257/321, 322, 257/316, 330, 331, 332, 333, 334

[56] References Cited

U.S. PATENT DOCUMENTS

| | | | |
|---|---|---|---|
| 4,975,384 | 12/1990 | Baglee | 437/43 |
| 5,045,490 | 9/1991 | Esquire et al. | 437/43 |
| 5,049,515 | 9/1991 | Tzeng | 437/43 |
| 5,071,782 | 12/1991 | Mori | 437/48 |
| 5,141,886 | 8/1992 | Mori | 437/43 |
| 5,180,680 | 1/1993 | Yang | 437/38 |
| 5,281,548 | 1/1994 | Prell | 437/43 |
| 5,315,142 | 5/1994 | Acovic et al. | 257/321 |
| 5,338,953 | 8/1994 | Wake | 257/321 |

FOREIGN PATENT DOCUMENTS

| | | | |
|---|---|---|---|
| 3-280580 | 12/1991 | Japan | 257/321 |

*Primary Examiner*—William D. Larkins
*Attorney, Agent, or Firm*—George O. Saile; Rosemary L. S. Pike

[57] ABSTRACT

A floating gate EPROM has surface source and drain regions, with a trench between the source and drain regions containing the floating and control gates. A thin tunneling oxide layer is located at the bottom of the trench and on the sidewalls of the trench adjacent the source and drain regions, with thicker gate oxide elsewhere in the trench.

8 Claims, 4 Drawing Sheets

TRENCH EEPROM WITH TUNNEL OXIDE IN TRENCH

This application is a division of application Ser. No. 08/276,605 filed Jul. 18, 1994 now U.S. Pat. No. 5,429,970.

BACKGROUND OF THE INVENTION (1) Field of the Invention

The invention relates to a method of fabricating semiconductor memory devices employing floating gates, and more particularly, to a method of improving coupling ratios of semiconductor memory devices employing floating gates.

(2) Description of the Prior Art

One class of semiconductor memory devices employ floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. "Flash" memory devices are those in which all of the cells can be erased in a single operation.

A typical Flash EEPROM of the prior art is illustrated in FIG. 1. A thin tunnel oxide layer 12 is formed on the surface of a semiconductor substrate 10. The tunnel oxide is necessary for the erasing function of the cell. The memory cell consists of the floating gate 14, interpoly dielectric layer 16, and the control gate 18. Source and drain regions 20 are shown on either side of the gate structure. Several problems exist with the prior art memory cell. The coupling ratio of the cell is low because of the thin tunnel oxide which exists over the entire channel area. As the size of the cell shrinks to the sub-micron regime, it suffers from short channel effect. That is, the transistor's threshold voltage and drain to source punchthrough voltage are reduced.

U.S. Pat. Nos. 5,180,680 to M. T. Yang and 5,049,515 to Tzeng show EEPROMs using a trench process.

SUMMARY OF THE INVENTION

A principal object of the present invention is to provide an effective and very manufacturable method of fabricating a flash EEPROM memory cell.

Another object of the present invention is to provide a method of providing an improved coupling ratio in a flash EEPROM memory cell.

Yet another object of the invention is to provide a method of providing improved short channel effect in sub-micron memory cells.

In accordance with the objects of this invention a new method of obtaining an improved coupling ratio and short channel effect in a Flash EEPROM memory cell employing a small controllable tunnel oxide is achieved. Field oxide regions are provided in and on a semiconductor substrate. Lightly doped drain regions are formed within the semiconductor substrate. The substrate is covered with a photoresist layer which is patterned. A trench is etched into the substrate using the patterned photoresist layer as a mask. The photoresist layer is removed. A thick gate oxide layer is formed over the surface of the substrate and within the trench. A layer of silicon nitride is deposited over the gate oxide layer and anisotropically etched away to leave spacers on the sidewalls of the trench. The spacers are overetched to expose an upper portion of the gate oxide layer on the sidewalls of the trench. The gate oxide layer not covered by the spacers is removed, exposing the horizontal silicon surface of the substrate in the center of the bottom of the trench and the upper portion of the silicon sidewalls of the trench above the spacers. A tunnel oxide layer is grown on the exposed silicon surfaces of the substrate and within the trench wherein the controllable small area of tunnel oxide within the trench provides an improved coupling ratio and the long channel afforded by the trenched channel region improves the short channel effect of the memory cell. The silicon nitride spacers are removed. A first polysilicon layer is deposited over the surface of the tunnel oxide and the gate oxide layers within the trench. The first polysilicon layer is doped. An interpoly dielectric layer is deposited over the first polysilicon layer. A second polysilicon layer is deposited overlying the dielectric layer and doped. The first and second polysilicon layers and the dielectric layer are patterned to form a stacked polysilicon structure wherein the first polysilicon layer forms a floating gate and the second polysilicon layer forms a control gate. Ions are implanted into the substrate using the stacked polysilicon structure as a mask to form source and drain regions on either side of the stacked polysilicon structure. Silicon oxide spacers are formed on the sidewalls of the stacked polysilicon structure. Passivation and metallization completes the fabrication of the memory cell.

BRIEF DESCRIPTION OF THE DRAWINGS

In the accompanying drawings forming a material part of this description, there is shown:

FIGS. 1 through 7 schematically illustrate in cross-sectional representation one preferred embodiment of the present invention.

DESCRIPTION OF THE PREFERRED EMBODIMENTS

Figure 1:
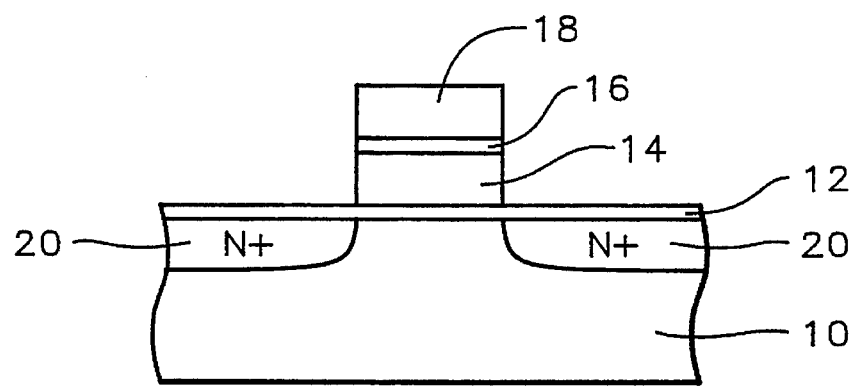
FIG. 1 schematically illustrates in cross-sectional representation a memory cell of the prior art.
Figure 2:
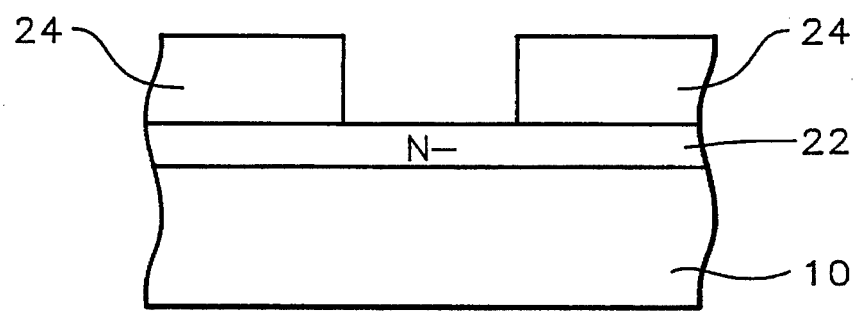

Referring now more particularly to FIG. 2, the process of the present invention will be described. A portion of a partially completed integrated circuit is illustrated in FIG. 2 consisting of a semiconductor substrate 10, preferably composed of monocrystalline silicon. A local oxidation of silicon (LOCOS) process is performed to provide device isolation regions, not shown. A lightly doped drain ion implantation is made into the substrate to form lightly doped drain region 22. This is typically an implantation of phosphorus ions with a dosage of between about 5 E 13 to 5 E 14 atoms/cm2 at a energy of between about 30 to 100 KeV.

Figure 3:
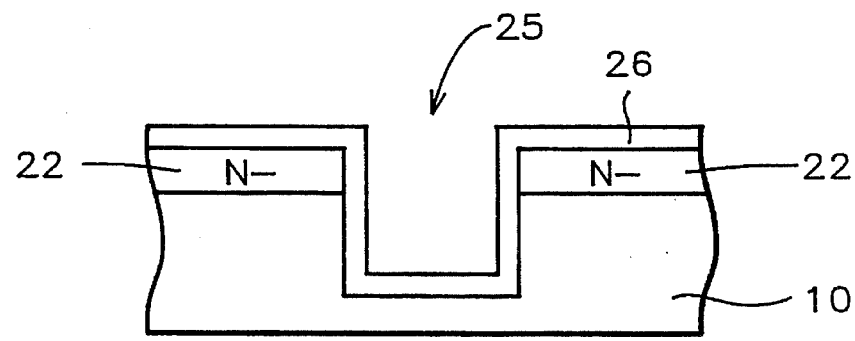

Next, a photoresist coating 24 is applied and patterned to provide a mask for a trench with a width of between about 3000 to 10,000 Angstroms. Referring now to FIG. 3, a trench is etched into the semiconductor substrate. The trench 25 is etched to a depth of between about 3000 to 8000 Angstroms. Next, thick gate oxide layer 26 is grown on the surface of the semiconductor substrate and within the trench. The gate oxide thickness is between about 200 to 300 Angstroms.

Figure 4:
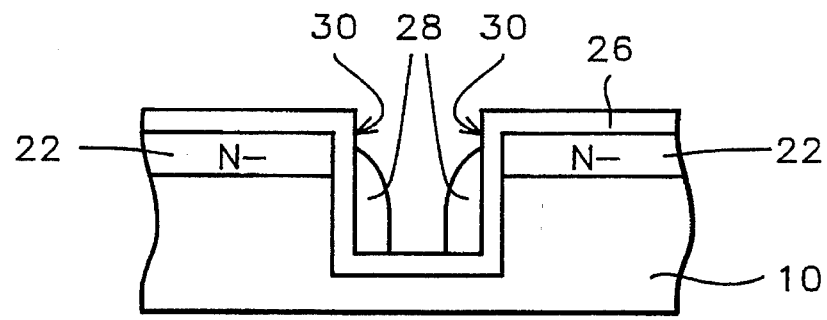

Referring now to FIG. 4, a layer of silicon nitride is deposited over the surface of the gate oxide layer to a thickness of between about 500 to 3000 Angstroms, depending upon the trench opening width. The silicon nitride layer is anisotropically etched to remove the layer leaving spacers 28 on the sidewalls of the trench. The spacers are overetched to provide room on the upper portions 30 of the sidewalls of the trench for the planned tunnel oxide region. This overetch can be between about 500 to 4000 Angstroms in depth. The smaller the tunnel oxide area, the better the coupling ratio.

Figure 5:
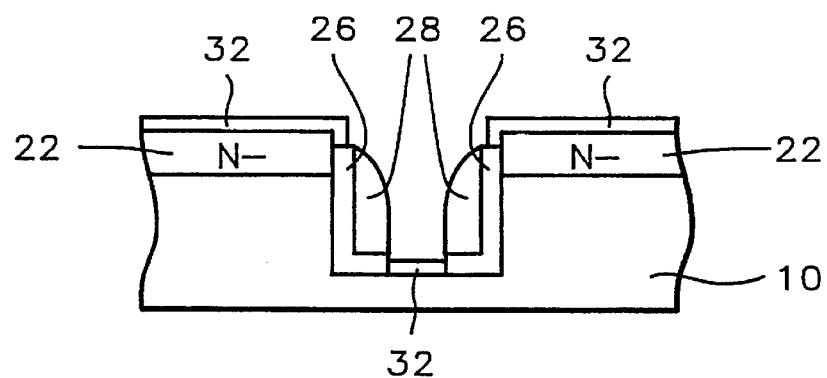

A silicon dioxide wet etch is used to remove the thick gate oxide not covered by the silicon nitride spacers. This will expose the silicon surfaces above the lightly doped drain regions 22 and within the trench at the center portion of the bottom surface and the upper portions of the sidewalls. The thin tunnel oxide 32 is grown on these exposed surfaces as shown in FIG. 5. The small controllable areas of tunnel oxide within the trench will provide the improved coupling ratio. The channel length along the etched trench region gives a longer channel length and results in a better short-channel effect for deep submicron devices. The tunnel oxide is grown to a preferred thickness of between about 60 to 100 Angstroms.

A wet etch is used to remove the silicon nitride spacers 28. This is typically done with phosphoric acid at between about 150° to 160° C. If some of the thin tunnel oxide is removed during the silicon nitride spacer etch, the tunnel oxide could be made thicker to begin with so that a sufficient thickness of tunnel oxide remains after the etch. Alternatively, a short regrow step can be performed to thicken the tunnel oxide.

Figure 6:
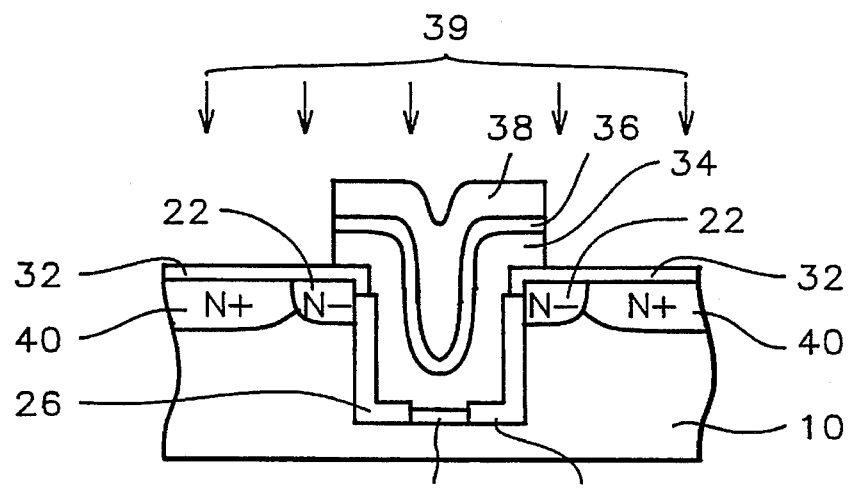

Referring now to FIG. 6, a layer of polysilicon 34 is deposited over the surface of the substrate and within the trench to a thickness of between about 1000 to 4000 Angstroms and doped. An interpoly dielectric 36, such as ONO (silicon oxide-silicon nitride-silicon oxide) is deposited over the polysilicon layer 34. A second polysilicon layer 38 is deposited over the dielectric 34 to a thickness of between about 2000 to 4000 Angstroms and doped. The first and second polysilicon layers and the interpoly dielectric layer are patterned to form a stacked polysilicon gate structure. The first polysilicon layer 34 forms the floating gate and the second polysilicon layer 38 forms the control gate of the memory cell.

Arsenic ions 39 are implanted into the substrate using the polysilicon gate structure as a mask to form source and drain regions 40 on either said of the stacked gate.

Figure 7:
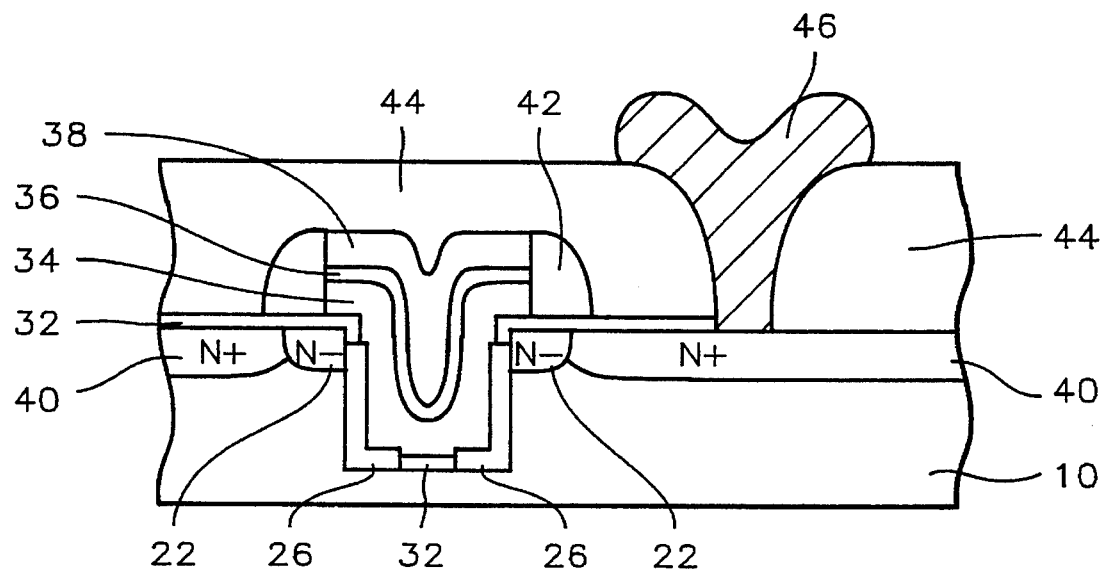

Back-end processing continues as is conventional in the art and as is illustrated in FIG. 7. Silicon dioxide spacers 42 are formed on the sidewalls of the stacked polysilicon gate structure. A dielectric layer 44, such as borophosphosilicate glass (BPSG), is deposited over the surface of the substrate. Contact openings are etched through the dielectric layer to expose the drain regions 40 where contact is desired. Metal layer 46, typically aluminum, is deposited and patterned to complete the contacts.

Figure 8:
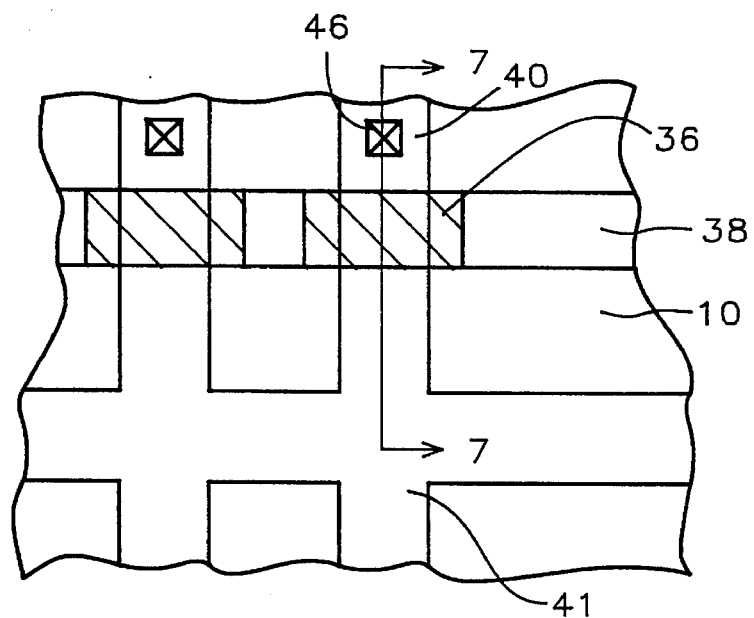
FIG. 8 illustrate a top plan view of the memory cell of the present invention.

A top view of the completed memory cell is shown in FIG. 8. View 7—7 is that shown in FIG. 7. The floating gate 36 and the control gate 38 are illustrated. The metal 46 completing contact is shown contacting the drain region 40. Source region 41 appears on the opposite side of the gates.

Figure 9:
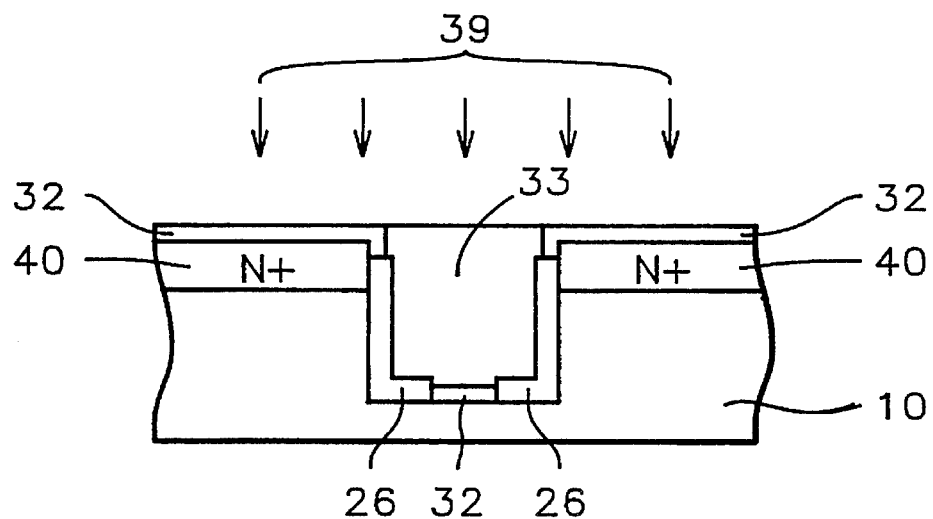
FIGS. 9 and 10 schematically illustrate in cross-sectional representation a second preferred embodiment of the present invention.
Figure 10:
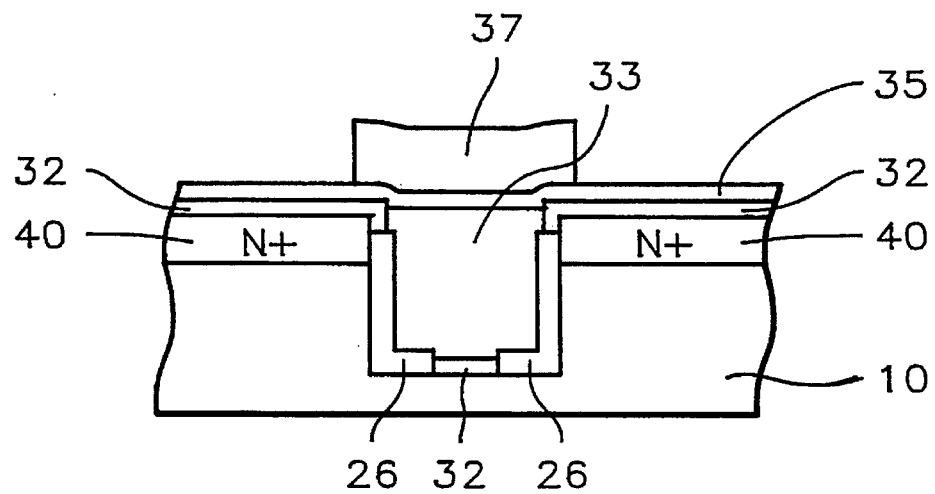

FIGS. 9 and 10 illustrate a second preferred embodiment of the present invention. The process proceeds as for the first embodiment through the steps illustrated in FIG. 5 and through the removal of the silicon nitride spacers. However, the process of forming the N- lightly doped drain region 22 can be omitted. In this embodiment, the first polysilicon layer 33 is deposited over the surface of the substrate and within the trench and doped, as above. However, the first polysilicon layer is deposited to a thickness sufficient to fill the trench, preferably between about 4000 to 10,000 Angstroms. As illustrated in FIG. 9, the polysilicon layer 33 is planarized, for example, by chemical mechanical polishing (CMP) to be flush with the surface of the substrate. This layer forms the floating gate of the memory cell.

Arsenic ions 39 are implanted into the substrate using the floating gate as a mask to form source and drain regions 40 on either said of the gate.

An interpoly dielectric 35, such as ONO (silicon oxide-silicon nitride-silicon oxide) is deposited over the floating gate 33. A second polysilicon layer 37 is deposited over the dielectric 35 to a thickness of between about 2000 to 4000 Angstroms and doped and patterned to form the control gate of the memory cell. Back-end processing is as described above.

The advantages of the present invention are: 1) the controllable small area of thin tunnel oxide results in a high coupling ratio for the flash memory, and 2) the raised source/drain area and longer channel length afforded by the trenched channel region improves the short-channel effect for sub-micron devices.

The following Example is given to show the important features of the invention and to aid in the understanding thereof. Variations may be made by one skilled in the art without departing from the spirit and scope of the invention.

EXAMPLE

The following table gives an example of the operation conditions for the Flash EEPROM cell of the present invention.

TABLE 1

| Operation | VW/L | VD | VS | Vsub |
| --- | --- | --- | --- | --- |
| program | −10 V | +5 V | floating | 0 |
| flash-erase | +15 V | 0 | 0 | 0 |
| read | +5 V | +2 V | 0 | 0 |

Table 1 shows the wordline (VW/L), drain (VD), source (VS), and substrate (Vsub) voltages which are reasonable operation conditions for a Flash EEPROM cell of the present invention.

While the invention has been particularly shown and described with reference to the preferred embodiments thereof, it will be understood by those skilled in the art that various changes in form and details may be made without departing from the spirit and scope of the invention.

What is claimed is:

1. The Flash EEPROM memory comprising:
   a stacked polysilicon gate structure in a trench within a semiconductor substrate and extending above said semiconductor substrate;
   source and drain regions on either side of said stacked polysilicon gate structure at the surface of said substrate;
   a thin tunnel oxide layer overlying said source and drain regions, on the sidewalls of the upper portions of said trench contacting said source and drain regions, and at a small center portion of the bottom of said trench;
   a thick gate oxide layer on the sidewalls and bottom of said trench not covered by said thin tunnel oxide layer;
   a polysilicon floating gate at the base of said stacked polysilicon gate structure;
   an interpoly dielectric layer overlying said polysilicon floating gate; and a polysilicon control gate overlying said interpoly dielectric layer.

2. The device of claim 1 wherein said tunnel oxide has a thickness of between about 60 to 100 Angstroms.

3. The device of claim 1 wherein said thick gate oxide layer is between about 200 to 300 Angstroms in thickness.

4. The device of claim 1 wherein said interpoly dielectric layer is composed of ONO (silicon oxide-silicon nitride-silicon oxide).

5. The Flash EEPROM memory comprising:

a polysilicon floating gate within a trench within a semiconductor substrate;

source and drain regions on either side of said floating gate at the surface of said substrate;

a thin tunnel oxide layer overlying said source and drain regions, on the sidewalls of the upper portions of said trench contacting said source and drain regions, and at a small center portion of the bottom of said trench;

a thick gate oxide layer on the sidewalls and bottom of said trench not covered by said thin tunnel oxide layer;

an interpoly dielectric layer overlying said polysilicon floating gate; and a polysilicon control gate overlying said interpoly dielectric layer.

6. The device of claim 5 wherein said tunnel oxide has a thickness of between about 60 to 100 Angstroms.

7. The device of claim 5 wherein said thick gate oxide layer is between about 200 to 300 Angstroms in thickness.

8. The device of claim 5 wherein said interpoly dielectric layer is composed of ONO (silicon oxide-silicon nitride-silicon oxide).

* * * * *